United States Patent

[11] 3,581,160

[72] Inventors Dante E. Piccone;
Daniel B. Rosser, both of Philadelphia, Pa.

[21] Appl. No. 786,251
[22] Filed Dec. 23, 1968
[45] Patented May 25, 1971
[73] Assignee General Electric Company

[54] SEMICONDUCTOR RECTIFIER ASSEMBLY HAVING HIGH EXPLOSION RATING

10 Claims, 4 Drawing Figs.

[52] U.S. Cl. .................................................... 317/234R, 317/235R, 317/234G, 317/235N, 317/234P, 317/235AB, 29/591, 174/140
[51] Int. Cl. .................................................... H01l 1/08, H01l 1/14
[50] Field of Search ........................................ 317/234, 4, 5.4, 6

[56] References Cited

UNITED STATES PATENTS

| | | | |
|---|---|---|---|
| 3,457,472 | 7/1969 | Mulski .......................... | 317/234 |
| 3,471,757 | 10/1969 | Sias ............................ | 317/234 |
| 3,443,168 | 5/1969 | Camp et al. ..................... | 317/234 |
| 3,437,887 | 4/1969 | Nowalk et al. ................... | 317/234 |
| 3,435,304 | 3/1969 | Bezouska et al. ................. | 317/234 |

*Primary Examiner*—Jerry D. Craig
*Assistant Examiner*—B. Estrin
*Attorneys*—J. Wesley Haubner, Albert S. Richardson, Jr., Melvin M. Goldenberg, Frank L. Neuhauser and Oscar B. Waddell

ABSTRACT: The main electrodes of a sealed semiconductor device are clamped between opposing metal members of a pressure assembly, and gaps between opposite ends of the insulating sidewall of the device and the respectively adjacent metal members are closed by resilient O-rings disposed in compression in the gaps and respectively circumscribed by rigid retaining rings.

INVENTORS:
DANTE E. PICCONE,
DANIEL B. ROSSER,
BY Albert S. Richardson, Jr.
ATTORNEY

SEMICONDUCTOR RECTIFIER ASSEMBLY HAVING HIGH EXPLOSION RATING

This invention relates to improvements in high-power rectifier assemblies including semiconductor devices of the kind wherein a semiconductor body is sandwiched under pressure between opposing electrodes of a sealed housing.

High-current solid-state rectifiers made of semiconductor material (e.g., silicon) are well known in the art of electric power conversion. A typical device of this kind comprises a semiconductor body in the shape of a broad area multilayer wafer disposed between flat metal electrodes joined to opposite ends of a hollow insulator to form a sealed housing or package for the wafer. If a two-layer (PN) silicon wafer is used, the device is a simple rectifier or diode, whereas if a four-layer (PNPN) wafer with gating means is used, the device is a controlled rectifier known in the art as a thyristor or SCR. In either case, it is common practice to support and to cool the device in a pressure assembly including a pair of good current and heat conductors which are clamped against the respective electrodes of the housing. When properly constructed and installed, such a rectifier can safely conduct continuous forward current of 250 amperes or more and brief surges of many thousands of amperes.

Even when properly designed and applied, a high-current semiconductor device may sometimes fail. There are a number of known causes for device failures, such as cyclic fatigue or excessive surge currents. The failure mechanism typically involves overheating localized areas of the silicon wafer which then lose blocking ability and permit the unimpeded flow of reverse current. In practice this will usually occur near the center of the wafer where short circuit current is well contained and will not cause permanent damage outside of the afflicted device itself. The failed device can then be replaced with a sound one, and the associated conversion apparatus can continue operating without expensive repairs or serious interruption of service. Occasionally, however, an electric arc may occur near the edge of a wafer where the housing of the device is especially vulnerable, and in this event external flashing or flame is possible with consequent propagation of the failure and widespread damage to other parts of the failure and widespread damage to other parts of the apparatus.

When its silicon body fails, the peak magnitude of current (having a given rate of rise and a given duration) to which a semiconductor rectifier assembly can be subjected without external flashing is herein referred to as the "explosion rating" of the assembly. As the demand grows for higher power semiconductor rectifier apparatus, so grows the need for high (e.g., 150,000 amperes) explosion ratings. Accordingly, it is a general objective of the present invention to increase the explosion ratings of such assemblies.

A more specific objective of the invention is to increase the explosion ratings of prior art semiconductor rectifier assemblies in a manner that is characterized by a relatively simple structural modification but surprisingly effective results.

In order to accomplish these objectives, we have modified the semiconductor rectifier assembly that is disclosed and claimed in U.S. Pat. No. 3,471,757 issued to F. R. Sias and assigned to the assignee of the present application. In the referenced assembly, the main electrodes of a sealed housing are compressed between the opposing ends of a set of two electroconductive posts which are otherwise spaced from the housing. To mechanically stabilize the housing and to exclude dust, gaps between the housing and the posts are closed by silicone rubber washers. To avoid interfering with the high pressure that the posts are required to exert directly on the main electrodes of the housing, the interposed rubber washers cannot be heavily loaded. We have dramatically increased the explosion rating of such an assembly by making two important changes therein: O-rings are substituted for the previously disclosed washers, and each O-ring is circumscribed by a metal flange or ring for impeding blowout thereof.

Our invention will be better understood and its various objects and advantages will be more fully appreciated from the following description taken in conjunction with the accompanying drawing in which.

Figure 2:
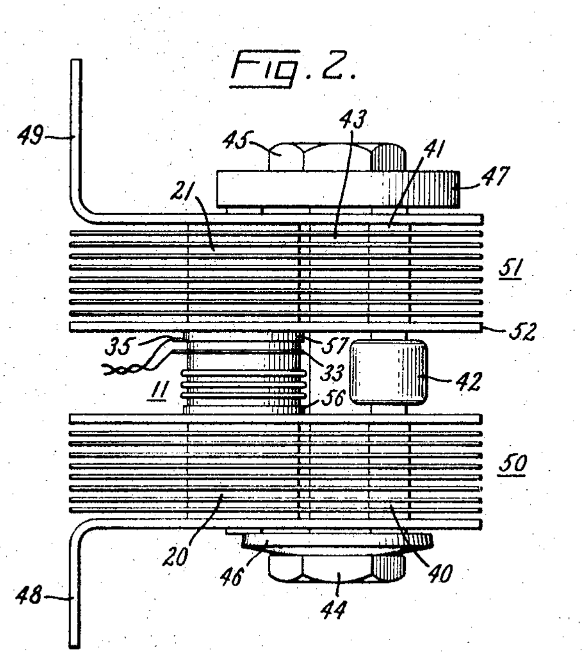
FIG. 2 is a side elevation of a preferred pressure mounting assembly for the device shown in FIG. 1.

The high-current semiconductor rectifier device 11 shown in FIG. 1 will now be described in detail, with the understanding that, except where otherwise indicated below, a plan (horizontal) view of the device would reveal that its various parts are circular. The device itself is not our invention, nor is the particular pressure assembly that has been illustrated for mounting the device. The present specification will conclude with claims that point out the particular combination we regard as our invention.

The device 11 is seen to include a disclike body 12 sandwiched between the flat bottoms 13 and 14 of a pair of cup-shaped terminal members whose rims 15 and 16 are bonded, respectively, to opposite ends 17 and 18 of a generally cylindrical hollow electrical insulator 19 to thereby form an integral, hermetically sealed housing for the body 12. This device is mounted under pressure between the opposing ends of a pair of force-transmitting electroconductive thrust members or posts 20 and 21 that serve as combined electrical and thermal conductors. As is shown in FIG. 1, the posts 20 and 21 are disposed in proximity to the housing but spaced therefrom, except where connected to the respective parts 13 and 14 of the device terminal members. A strain buffer 22 is preferably disposed in compression between the external surface of part 14 and the cooperating contact surface of post 21.

The interior disclike body 12 of the device 11 is made of semiconductor material. It preferably comprises a thin, relatively broad area, circular slice or wafer of asymmetrically conductive silicon on a thicker disclike substrate of tungsten. It can be constructed by any one of a number of different techniques that are well known in the art today. Its diameter typically is 1.25 inches. Internally, the silicon wafer will have at least one broad area PN rectifying junction generally parallel to its faces. The device shown for illustration purposes is actually a thyristor (i.e., a controlled rectifier), and its wafer is therefore characterized by four layers of alternately P and N type conductivity, one of which is provided with a peripheral gate contact to which a flexible gate lead 23 is connected. Assuming that a P-layer is ohmically connected to the tungsten substrate, the forward direction of conventional current through the body 12 is upwardly as viewed in the drawing. A protective coating 24 of insulation (e.g., silicone rubber) is deposited on the annular area of the body 12 radially beyond its upper face and on the part of this face that is adjacent to the peripheral gate contact.

Figure 1:
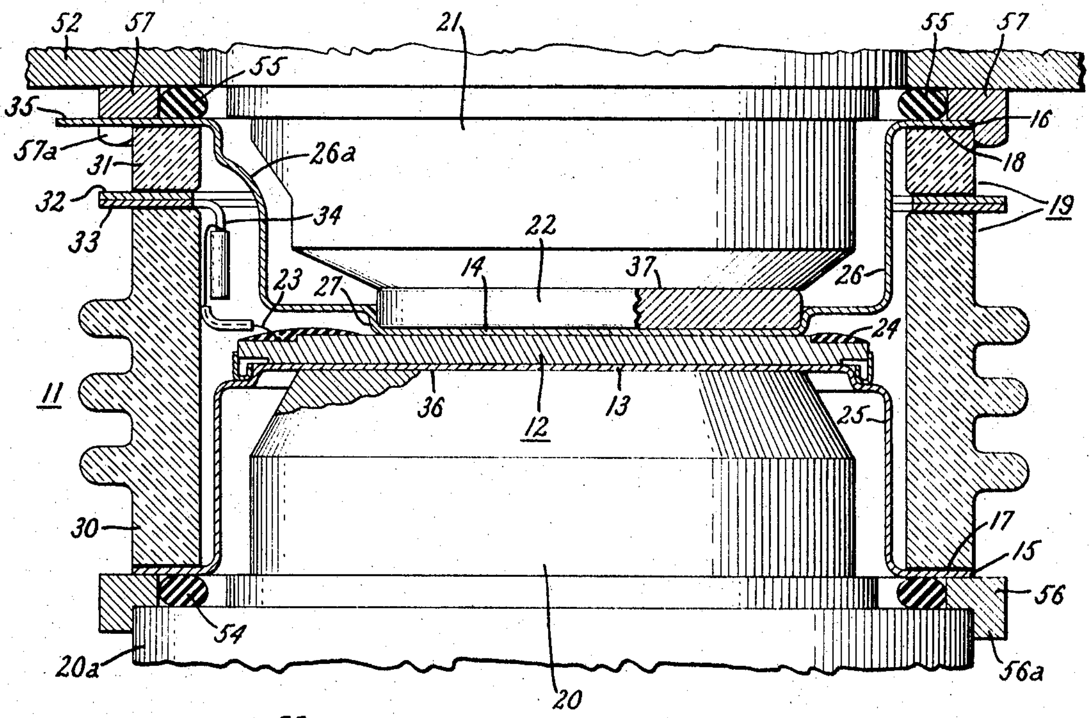
FIG. 1 is a magnified elevational view, in section, of a high-power semiconductor controlled rectifier device in a combination that embodies our invention.

As can be seen in FIG. 1, the opposite faces of the body 12 respectively adjoin and are in pressure contact with opposing plane surfaces of the parallel bottoms 13 and 14 of the spaced-apart terminal members of the device 11. These parts conduct load current between the posts 20 and 21 and the interior body 12 and therefore serve as the main electrodes of the device (hereinafter referred to as anode 13 and cathode 14). Each is relatively thin and ductile, being made of electroconductive material such as nickel-plated copper, although tungsten or the like could be used if desired.

The anode 13 is joined to the insulator 19 by means of a sidewall 25 integrally connected to the flared rim 15 which in turn is attached by brazing or the like to a metallized lower end 17 of the insulator. Thus the components 13, 15, and 25 comprise the cup-shaped terminal member whose sidewall 25 is part of a somewhat elastic annular diaphragm extending inside the hollow insulator 19 as shown. A generally similar terminal member is formed by the cathode 14, the rim 16, and an interconnecting sidewall 26, except that the latter is not circular because a portion 26*a* of this sidewall is indented to form an enlarged pocket for connecting the lead 23 to a ring gate as described below. Unlike the circular anode 13, the cathode 14 is generally D-shaped due to a peripheral segment being omitted from its left side 27, whereby the internal surface of the cathode adjoining the upper face of the body 12 is correspondingly relieved in the vicinity of the peripheral gate contact. It will be observed that the rim 16 of the cathode terminal member has a tab 35 projecting radially outwardly beyond the compass of the insulator 19 where it provides a convenient place to attach an external gate-signal reference wire.

In order to make the interior gate lead 23 externally accessible, the device 11 also includes a control electrode traversing the insulator 19. The insulator 19, as is plainly shown in FIG. 1, actually is in the form of a sleeve comprising two coaxial rings 30 and 31. These rings preferably are ceramic. The part 31 whose metallized upper end 18 is brazed to the rim 16 of the cathode terminal member of the device 11, has only a short axial dimension, whereas the part 30 comprises a relatively long cylinder surrounding not only the anode 13 and the semiconductor body 12 but also the cathode 14 and the bottom half of the sidewall 26 associated therewith. The two ceramic parts 30 and 31 are joined together by means of two metal rings 32 and 33, the latter serving as the control electrode of the device 11. The ring 33 is bonded to the metallized upper end of the ceramic 30 and protrudes annularly beyond it, while the metal ring 32 is bonded to the metallized lower end of the ceramic 31 and similarly protrudes annularly beyond it. The contiguous metal rings 32 and 33 are welded together around their outer perimeters to complete the hermetically sealed housing for the semiconductor body 12. Preferably this is done in an inert atmosphere, whereby oxygen and other undesirable gases are permanently excluded from the housing. Inside the housing the gate lead 23 is connected to a conductive tab 34 of the control electrode 33 as shown.

The semiconductor body 12 is held mechanically between and electrically in series with the main electrodes 13 and 14 of the device 11 by pressure. No solder or other means is used for bonding these parts together. Electric contact between the metal faces of the body 12 and the adjoining internal surfaces of the respective electrodes is effected merely by their pressure engagement with each other over the generally circular interface area. This pressure is provided in the first instance by the elastic nature of the anode and cathode terminal members that are disposed on opposite sides of the device 11. In addition, the anode 13 and the cathode 14 of the illustrated device are firmly pressed toward one another by means of the external posts 20 and 21, whereby an even more intimate high-current, low-resistance interface connection is obtained. Any suitable external pressure mounting arrangement can be used for the device 11, and a preferred embodiment will now be described with reference to FIG. 2.

We have illustrated in FIG. 2 a pressure assembly that is the claimed subject matter of the previously mentioned copending Sias application. In essence it comprises two or more parallel sets of aligned, spaced-apart thrust members, a plurality of separable interconnection means respectively disposed in the gaps between the thrust members of these sets, at least one of the aforesaid interconnection means comprising a semiconductor device 11, and a tension member extending centrally between and parallel to the various sets of thrust members and having opposite ends mechanically connected to the respective members of each set, whereby all of the thrust members are firmly clamped against the respective interconnection means. The thrust members between which the device 11 is mechanically disposed comprise the previously mentioned electroconductive posts 20 and 21.

The associated thrust members or posts 20 and 21 are generally cylindrical in shape, and they are made of highly conductive metal such as aluminum, brass, or copper, preferably the latter. As is best seen in FIG. 1, opposing ends of these posts are tapered to fit inside the cup-shaped terminal members of the device 11 where they are terminated by facing contact surfaces 36 and 37, respectively. The surface 36 of post 20 generally conforms to and parallels the adjoining external contact surface of the anode 13 of the device 11. The surface 37 of post 21 is adjacent to the external contact surface of the cathode 14, and the strain buffer 22 (preferably of tungsten) is disposed therebetween. Consequently, each of the main electrodes 13 and 14 of the device 11 is conductively coupled to one of the facing surfaces 36 and 37 of the copper posts 20 and 21 over a relatively broad area, and the device 11 is connected electrically in series with these posts.

Paralleling the set of copper posts 20 and 21 and the interposed device 11 is at least another set of spaced-apart axially aligned thrust members comprising a pair of steel posts 40 and 41. As is indicated in FIG. 2, a rigid spacer 42 of electrical insulating material is disposed in the gap between opposing ends of the posts 40 and 41. This spacer 42 is axially compressed between posts 40 and 41, and the main electrodes of the device 11 are compressed between the posts 20 and 21, by means of the tension member which comprises an elongated steel tie bolt disposed in an insulating sleeve 43 and having nuts 44 and 45 on opposite ends thereof. The nut 44 is connected to the outer ends of the posts 20 and 40 by way of a Bellville spring washer 46, while the nut 45 is connected to the outer ends of the posts 21 and 41 by way of a similar spring washer (not shown) and an insulating collar 47. Thus, by tightening the nuts on the tie bolt, the copper posts are subjected to a high axial thrust and the device 11 can be firmly but separably clamped in the assembly.

For the dual purposes of electrically connecting the semicondutor device 11 to an external high-current circuit and of mechanically supporting the whole assembly, the copper posts 20 and 21 are furnished with takeoff means comprising a pair of L-shaped copper bars or buses 48 and 49 respectively attached to these posts. The distal ends of the bars 48 and 49 are adapted to be bolted to suitable electric current conductors of an external electric circuit (not shown). For added strength and rigidity, the bar 48 is also attached to the steel post 40 and the bar 49 is similarly attached to the other steel post 41.

The two copper posts 20 and 21 serve not only as mechanical supports and electrical contacts but also as thermal heat sinks for the semiconductor device 11. In order to promote the dissipation of heat from these posts, they have been equipped, respectively, with two groups 50 and 51 of spaced metal cooling fins. The first cooling fin 52 on the inner end of the group 51 is partially shown in FIG. 1. It is affixed to the body of the post 21 by brazing or the like, whereby the fin 52 and the post 21, along with the bar 49 and the strain buffer 22, are all integral parts of the means that is provided for supporting and cooling the semiconductor device 11 and for connecting its cathode 14 tp the external electric circuit.

When a high-current device 11 is mounted between the copper posts 20 and 21, as is shown in FIG. 1, its anode 13 and cathode 14 are tightly squeezed against the interior disc like semiconductor body 12. High pressure (e.g., 3,000 p.s.i.) is uniformly exerted on the adjoining contact surfaces of these parts, thereby ensuring good electrical and thermal conductivity across their broad-area junctions. However, the body 12 is not constrained radially except by friction.

To avoid interfering with obtaining high contact pressure on the anode 13 and the cathode 14, the insulating sleeve 19 of the device housing is spaced from the metal member comprising parts 21 and 52 and from the opposite member 20. This is best shown in FIG. 1. According to the teachings of Sias, the resulting gaps between each end of the insulator 19 and the respectively adjacent thrust members are closed by silicone rubber washers in order to help mechanically stabilize the device 11 and to prevent dust and other contaminators from entering the space around the copper posts 20 and 21. The loading of these washers must be kept relatively low so that most of the mounting pressure is exerted directly on the anode and cathode of the interposed device 11.

In operation, the assembly that has been described hereinbefore can safely conduct in a forward sense high magnitudes of steady state current and, for relatively short periods of time, even much higher magnitudes of surge current. Nevertheless, as was noted in the introductory portion of our specification, a device 11 may sometime be subjected to an abnormal condition (for example, a surge of current exceeding its maximum capability) that causes it to permanently fail. This failure mode is a short circuit through the silicon body 12, and the external electric circuit will ordinarily include suitable protective means (such as an electric fuse, not shown) to isolate the failed device which can then be replaced by a new one. While the protective means takes only a short time successfully to complete its isolating function, a substantial amount of current can be let through during that time. Consequently, in the event an arc occurs near the edge of the body 12, there is a real possibility that it will quickly become so intense as to burn a hole through the relatively thin portions of the terminal members of the housing that lie beyond the perimeter of the anode 13 or the cathode 14, thereby allowing sparks or flame to extend outside the sealed housing. In tests conducted on the Sias assembly, an external flash has in fact been observed under these conditions, and in practice this could seriously endanger other sound devices and apparatus that typically are located in the vicinity.

In accordance with the present invention, the explosion rating of such an assembly is significantly increased by using o-rings 54 and 55 in the aforesaid gaps and by respectively circumscribing these rings with rigid means 56 and 57 for impeding their blowout. In addition, while not shown in the drawing, a sleeve of ablative material, such as glass filled Teflon, is preferably inserted in the sealed housing so as to shield the inside surface of the insulator 19 from any arc in the silicon body 12.

As is shown in the FIG. 1 embodiment of our invention, the O-ring 54 is compressed between the rim 17 of the annular diaphragm 25 and an overlying shoulder **20*a* of the metal post 20, while the O-ring 55 is compressed between the rim 16 of the annular diaphragm 26 and the metal fin 52** adjacent thereto. Each of these O-rings is made of relatively soft, yieldable material that is capable of being deformed under pressure and that tends to recover its former shape if the deforming force is removed. Elastomers are well suited for this purpose. Hereinafter the material of the O-rings will be generally characterized as "elastic."

The diameter of the original circular cross-sectional area of each O-ring 54, 55 is slightly larger than the axial dimension of the gap in which it is disposed. Therefore, in the final assembly these rings are squeezed into oval cross-sectional shapes as shown. This effectively seals off the respective gaps from egress of arcs and arc products without significantly compromising high contact pressure on the main electrodes of the device 11.

The O-rings 54 and 55 are respectively circumscribed by rigid means 56 and 57 which, as is shown in FIG. 1, comprise separate retaining rings of relatively strong material such as metal (e.g., lead, brass, or steel). Each retainer has an inside diameter slightly larger than the original outside diameter of the associated O-ring, and its axial dimension is sufficiently short so that it fits snugly (as shown) in the same gap as the O-ring without normally absorbing appreciable mechanical load. To limit displacement of the retainer 56 in a radial direction, it is provided with an integral skirt **56*a* that overlaps the shoulder 20*a* of the post 20. For the same reason a skirt 57*a* of the retainer 57 overlaps the upper end of the insulator 19 as shown. (The tab 35 projects radially through a cooperating notch in the skirt 57*a*.**)

If a device 11 were to fail and an arc were to burn through one or both of its terminal members, the arc would still be confined by the O-rings. In the event the confined arc were to cause a build up of pressure sufficient to move the O-ring material outwardly from the gap in which it is normally disposed, such movement would be resisted by the associated retaining ring 56 or 57, whereby blowout of the O-rings is impeded and external flashing is prevented.

Figure 3:
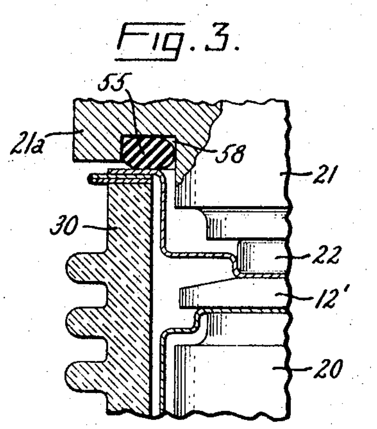
FIG. 3 is a fragmentary sectional detail of another embodiment of the invention.

The FIG. 3 embodiment of our invention differs from that previously described in two respects. The device illustrated is a diode, and therefore its semiconductor body 12' has no gate contact and the enclosing sleeve 30 of insulating material has no control electrode traversing the same. As is clearly indicated in FIG. 3, the rigid means circumscribing the O-ring 55 for impeding blowout thereof comprises a down-turned flange **21*a* of the metal thrust member 21. This flange forms with the body of the member 21 an annular groove 58 that overlies the upper end of the insulating sleeve 30, and the O-ring 55 is disposed in the groove 58** as shown.

Figure 4:
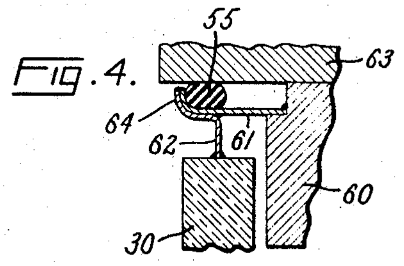
FIG. 4 is a fragmentary sectional detail of yet another embodiment.

FIG. 4 illustrates the mounting of a semiconductor device wherein one of the main electrodes of its housing comprises a relatively thick disc 60 which is joined to the insulating sleeve 30 by means of a thin annular diaphragm 61 that mates with a metal collar 62 brazed to the upper end of the sleeve 30. The O-ring 55 has a diameter approximately the same as that of the corresponding end of the sleeve 30, and it is disposed in compression between the diaphragm 61 and an overlying metal thrust member 63. In this embodiment, the blowout impeding function is performed by an upturned flange 64 of the diaphragm 61.

While we have shown and described several forms of our invention by way of illustration, other modifications will undoubtedly occur to those skilled in the art. We therefore intend herein to cover all such modifications as fall within the true spirit and scope of the invention.

What we claim as new and desire to secure by Letters Patent of the United States is:

1. In a semiconductor rectifier assembly:

a. a semiconductor device comprising a pair of main electrodes, a semiconductor body disposed mechanically between and electrically in series with said electrodes, and a sealed housing for said body, said housing including said electrodes, a generally cylindrical hollow insulator, and means for joining said electrodes to opposite ends of said insulator including at least one annular metal diaphragm connecting at least one electrode to a corresponding end of said insulator;

b. means separate from said device for mounting said device and for connecting the main electrodes thereof to an external electric circuit, said mounting and connecting means comprising at least one metal member disposed in proximity to said housing but spaced therefrom except where connected to said one electrode;

c. at least one ring of elastic material disposed in compression in a gap between said one member and said diaphragm of said housing near said corresponding end of said insulator; and d. relatively rigid means circumscribing said ring for impeding blowout thereof.

2. The assembly of claim 1 in which said relatively rigid means for impeding blowout of said ring is a flange of said one member.

3. The assembly of claim 1 in which said relatively rigid means for impeding blowout of said ring is a flange of said diaphragm.

4. The assembly of claim 1 in which said relatively rigid means for impeding blowout of said one ring is a separate metal ring.

5. The assembly of claim 1 in which said hollow insulator is in the form of a sleeve, part of said metal member overlies one end of said sleeve, and said one ring is disposed in a gap between said part and said one end of said sleeve, whereby said gap is sealed by said ring.

6. The assembly of claim 5 in which said ring is an O-ring and has a diameter approximately the same as that of said one end of said sleeve, and in which said relatively rigid means is a separate metal ring having an inside diameter larger than the outside diameter of said O-ring.

7. The assembly of claim 6 in which said metal ring includes a skirt overlapping said one end of said sleeve to limit displacement thereof in a radial direction.

8. The assembly of claim 6 in which said metal ring includes a skirt overlapping said part of said metal member to limit displacement thereof in a radial direction.

9. In a semiconductor rectifier assembly:

a. a semiconductor device comprising a pair of main electrodes, a semiconductor body disposed mechanically between and electrically in series with said electrodes, an insulating sleeve, and annular metal diaphrams for joining said electrodes to opposite ends of said sleeve to form a sealed housing for said body;

b. means outside said housing for connecting said device to an external electric circuit comprising a pair of metal members having facing contact surfaces, said device being disposed with its main electrodes between the facing contact surfaces of said members but with its insulating sleeve spaced therefrom;

c. a pair of O-rings disposed between said sleeve and the respective metal members for sealing the gaps therebetween; and d. relatively rigid means circumscribing the respective O-rings for impeding blowout thereof.

10. The assembly of claim 9 including pressure-applying means connected to said metal members for compressing said O-rings and for pressing said main electrodes toward one another.